(12) United States Patent
Wassink

(10) Patent No.: US 7,442,948 B2
(45) Date of Patent: Oct. 28, 2008

(54) CONTAMINATION BARRIER AND LITHOGRAPHIC APPARATUS

(75) Inventor: Arnoud Cornelis Wassink, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 394 days.

(21) Appl. No.: 11/433,761

(22) Filed: May 15, 2006

(65) Prior Publication Data

US 2008/0067454 A1   Mar. 20, 2008

(51) Int. Cl.
*H01J 65/04* (2006.01)
(52) U.S. Cl. .................................. 250/504 R
(58) Field of Classification Search ............. 250/504 R
See application file for complete search history.

(56) References Cited

U.S. PATENT DOCUMENTS

| | | | |
|---|---|---|---|
| 4,408,338 A | 10/1983 | Grobman | 378/34 |
| 4,837,794 A | 6/1989 | Riordan et al. | 378/119 |
| 6,359,969 B1 | 3/2002 | Shmaenok | 378/156 |
| 6,459,472 B1 | 10/2002 | De Jager et al. | 355/68 |
| 6,838,684 B2 | 1/2005 | Bakker et al. | 250/492.2 |
| 7,034,308 B2 | 4/2006 | Bakker et al. | 250/370.08 |
| 7,057,190 B2 | 6/2006 | Bakker et al. | 250/492.2 |
| 7,106,832 B2 | 9/2006 | Klunder et al. | 378/156 |
| 7,145,132 B2 * | 12/2006 | Bakker et al. | 250/251 |
| 7,365,345 B2 * | 4/2008 | Wassink | 250/492.2 |
| 7,397,056 B2 * | 7/2008 | Sjmaenok et al. | 250/504 R |
| 2004/0108465 A1 | 6/2004 | Bakker et al. | 250/492.1 |
| 2004/0184014 A1 | 9/2004 | Bakker et al. | 355/30 |
| 2005/0122491 A1 | 6/2005 | Bakker et al. | 355/30 |
| 2006/0012761 A1 | 1/2006 | Bakker et al. | 355/30 |
| 2006/0138348 A1 | 6/2006 | Bakker | 250/492.1 |
| 2006/0138362 A1 | 6/2006 | Bakker et al. | 250/504 |
| 2006/0139604 A1 | 6/2006 | Wassink et al. | 355/67 |
| 2006/0151717 A1 | 7/2006 | Klunder et al. | 250/492.2 |
| 2006/0169929 A1 | 8/2006 | Wassink | 250/504 |
| 2006/0186353 A1 | 8/2006 | Wassink | 250/492.2 |
| 2006/0219958 A1 | 10/2006 | Wassink | 250/504 |
| 2006/0261290 A1 | 11/2006 | Van Herpen et al. | 250/492.2 |
| 2007/0018118 A1 | 1/2007 | Sjmaenok et al. | 250/492.2 |
| 2007/0023706 A1 | 2/2007 | Sjmaenok et al. | 250/504 |

FOREIGN PATENT DOCUMENTS

| | | |
|---|---|---|
| EP | 1 274 287 A1 | 1/2003 |
| EP | 1 491 963 A2 | 12/2004 |
| EP | 1 491 963 A3 | 8/2005 |

(Continued)

OTHER PUBLICATIONS

PCT International Search Report and Written Opinion issued for PCT Application No. PCT/NL2007/050198, dated Aug. 7, 2007.

*Primary Examiner*—David A. Vanore
(74) *Attorney, Agent, or Firm*—Pillsbury Winthrop Shaw Pittman, LLP

(57) ABSTRACT

A rotatable contamination barrier is disclosed. The barrier includes a plurality of closely packed blades for trapping contaminant material coming from an EUV radiation source. The blades are oriented radially relative to a central rotation axis of the contamination barrier. The contamination barrier is segmented in an inner segment and an outer segment relative to the central rotation axis. Accordingly, higher revolution speeds may be attained without compromising the contamination barrier.

12 Claims, 5 Drawing Sheets

FOREIGN PATENT DOCUMENTS

| | | |
|---|---|---|
| JP | 9-320792 | 12/1997 |
| JP | 2000-98098 | 4/2000 |
| JP | 2001-57298 | 2/2001 |
| WO | WO 99/42904 | 8/1999 |
| WO | WO 01/37309 A1 | 5/2001 |

* cited by examiner

CONTAMINATION BARRIER AND LITHOGRAPHIC APPARATUS

FIELD

The present invention relates to a contamination barrier and a lithographic apparatus comprising the same.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising one, part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Radiation sources used in EUV lithography typically generate contaminant material that is harmful to the optics and the working environment wherein the lithographic process is carried out. Such is especially the case for EUV sources operating via a laser induced plasma or discharge plasma. Hence, in EUV lithography, a desire exists to limit the contamination of the optical system arranged to condition the beam of radiation coming from an EUV source. To this end, a foil trap, for instance, as disclosed in European patent application publication EP 1491963, has been proposed. A foil trap uses a high number of closely packed foils or blades. Contaminant debris, such as micro-particles, nano-particles and ions can be trapped in the walls provided by the blades. Thus, the foil trap functions as a contamination barrier trapping contaminant material from the source.

SUMMARY

In an embodiment, a rotatable foil trap may be oriented with a rotation axis along an optical axis of the system, in particular in front of an extreme ultraviolet radiation source configured to provide extreme ultraviolet radiation. The blades configured to trap contaminant material thus may be radially oriented relative to a central rotation axis of the contamination barrier and may be aligned substantially parallel to the direction of radiation. By rotating the foil trap at a sufficiently high speed, traveling contaminant debris may be captured by the blades of the contaminant barrier. Due to design limitations, the rotation speed of the contaminant barrier may be quite high, since otherwise the length of the blades along the direction of travel of the debris would be unacceptably large. Typical revolution speeds are 15000-30000 RPM, speeds which may cause considerable stress in the metal compound of the contaminant barrier, in particular, in the operative temperature of the radiation source, where the contaminant barrier may heat up to temperatures well above 600° C. Furthermore, potential breakdown of the contaminant barrier may be harmful for the machine, and may cause considerable costly down time. In an embodiment, a radiation system configured to provide a projection beam of radiation comprises a rotatable contamination barrier comprising a plurality of closely packed blades configured to trap contaminant material coming from a radiation source.

It is desirable to provide a radiation system that is more robust and which has an increased strength of the contamination barrier, in particular, the blades thereof. According to an aspect of the invention, there is provided a rotatable contamination barrier for use in an EUV system, comprising a plurality of closely packed blades for trapping contaminant material coming from an EUV radiation source, the blades being radially oriented relative to a central rotation axis of the contamination barrier. The contamination barrier is segmented in an inner segment and an outer segment relative to the central rotation axis, respectively.

In an embodiment, a lithographic apparatus is provided. The lithographic apparatus includes a radiation system comprising an EUV radiation source for providing an EUV beam of radiation, and a rotatable contamination barrier comprising a plurality of closely packed blades for trapping contaminant material coming from the EUV radiation source. The blades are oriented radially relative to a central rotation axis of the contamination barrier. The contamination barrier is segmented in an inner segment and an outer segment relative to the central rotation axis. The apparatus also includes a support constructed to support a patterning device. The patterning device is capable of imparting the beam of radiation with a pattern in its cross-section to form a patterned radiation beam. The apparatus further includes a substrate table constructed to hold a substrate, and a projection system configured to project the patterned radiation beam onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
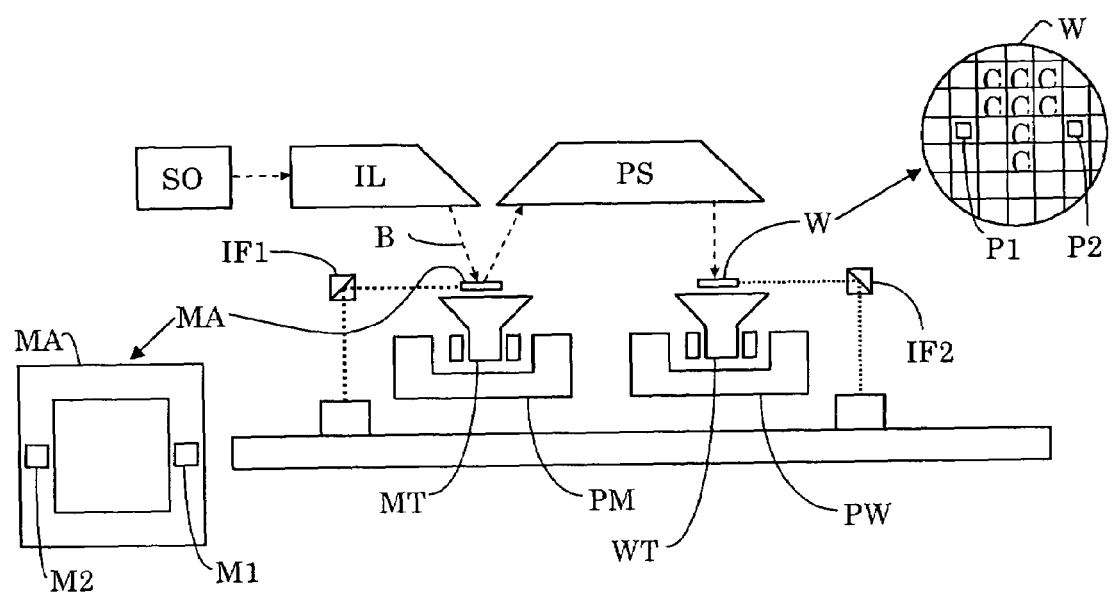
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases, the source may be an integral part of the lithographic apparatus, for example when the source is a mercury lamp. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IFI can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
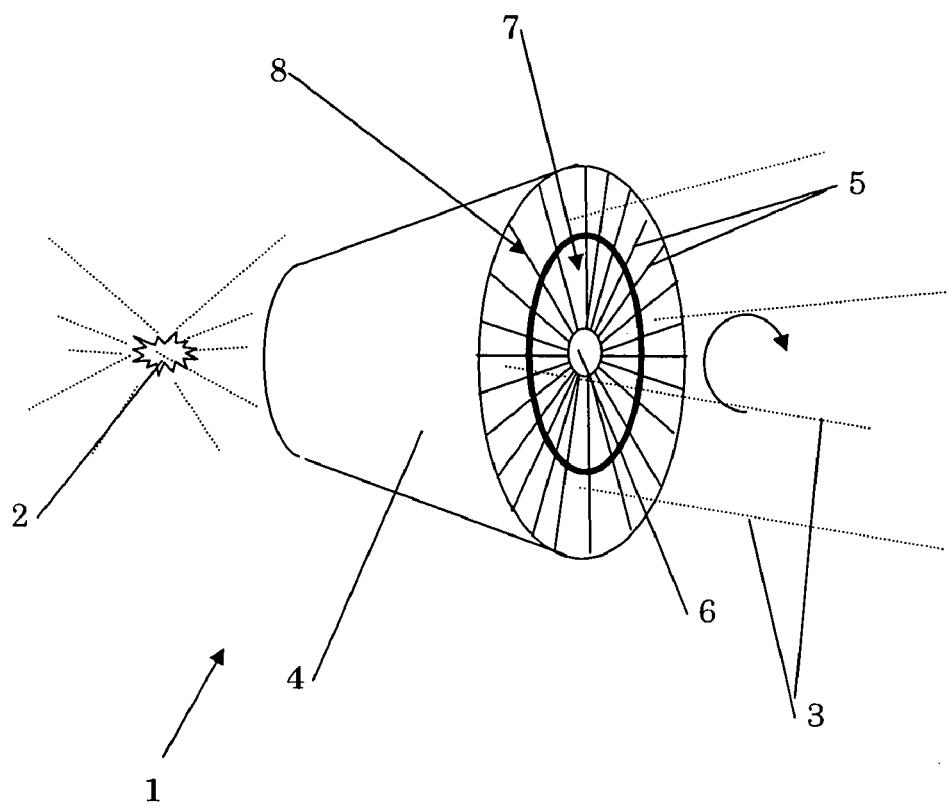
FIG. 2 shows a general setup of a rotating foil trap according to an embodiment of the invention.

FIG. 2 schematically shows a radiation system 1 configured to provide a projection beam of radiation. The radiation system 1 comprises an extreme ultraviolet radiation source 2 configured to provide extreme ultraviolet radiation. In the Figure, the dashed lines represent EUV radiation 3 coming from an EUV source 2, typically a laser induced plasma source or a plasma discharge source such as a tin, lithium or xenon source, however, other sources are possible, in particular, any other source that produces EUV radiation in combination with fast particles that escape from the source 2 and that should be trapped in order to prevent damage to the downstream optics of the lithographic apparatus (not shown). Further, a rotatable contamination barrier 4 is provided comprising a plurality of closely packed blades 5 configured to trap contaminant material coming from the radiation source 2. The blades 5 are radially oriented relative to a central rotation axis 6 of the contamination barrier 4. Another name for the barrier is a (rotatable) foil trap. By rotation of the blades 5, fast moving particles, in particular, tin particles and gaseous and ion like particles traveling away from the source 2, can be trapped while EUV radiation, due to the speed of light, can travel generally unhindered by the blades 5.

The foil trap 4 thus functions as a contamination barrier to trap contaminant material coming from the radiation source 2. Typically, the blades 5 are arranged at a distance of 0.3-5 mm apart and have a generally rectangular form. Advantageously, the source 2 is positioned at an intersection of extended planes through the plurality of blades 5 which define an optical center of the contamination barrier 1, which in FIG. 2 coincides with the central axis 6 of the foil trap 4. For an ideal point like EUV source 2 at this center, radiation would pass in a direction generally parallel to an orientation of the blades 5. Thus, shielding of EUV radiation is low and only takes place over a thickness of the blade (which, in an embodiment, is accordingly kept small without compromising mechanical integrity). A typical value of the thickness of the blade can be about 100 microns, which may result in a shielding of about 10 percent of the radiation. Due to the high rotation speed, in particular, with a high process temperature of the contamination barrier of well above 600° C., considerable stress may arise in the blades 5. For example, for a plasma source 2, an estimated particle speed may be about 600-1000 m/s. Typical dimensions of the blades 5 are 40-50 mm long in the radial direction, and 15-25 mm long in the axial direction. A typical thickness of a blade is 80-120 micrometers. For such dimensions, the blades 5, when rotated at speeds of 15000-30000 RPM, may experience a tensile force of about 100-200 N/mm$^2$.

To improve structural integrity, according to the invention, the contamination barrier 4 is segmented in an inner segment 7 and an outer segment 8 relative to the central rotation axis 6, respectively. Accordingly, a tensile stress to the blades 5 is reduced. A typical radial length of the blades 5 in the first and/or second segments can be 15-50 mm.

Accordingly, a higher angular range of radiation can be attained, spanning a cone segment having a top angle of about 50 degrees originating from the source 2. Thus, an increased light reception is possible, thus transmitting more radiant power to the lithographic apparatus.

For instance, the contamination barrier may comprise an inner segment 7 in the form of a truncated cone spanning a top angle of about 30-40 degrees and an outer segment 8 in the form of a hollow truncated cone spanning a top angle ranging between 45-55 degrees. Accordingly, an angular segment of about 10-35 degrees originating from the source can be spanned by the inner segment 7, and an angular segment of about 35-50 degrees originating from the source can be spanned by the outer segment 8.

Thus, with tensile creep strength of the blade material not being a possible limiting factor, other structural features of the foil trap 4 can be optimized, such as blade thickness (which can be reduced) to improve the transmittance; cleanability of the blades or reducing material costs and/or tolerance requirements.

It is estimated that this design can transmit almost twice as much as a conventional rotating foil trap 4, although the supportive structure for the outer segment 8 may provide some obstruction to the light transmission. However, since the foil trap may be radially much more extended than conventional structures, more light can be transmitted to the lithographic apparatus.

Figure 3:
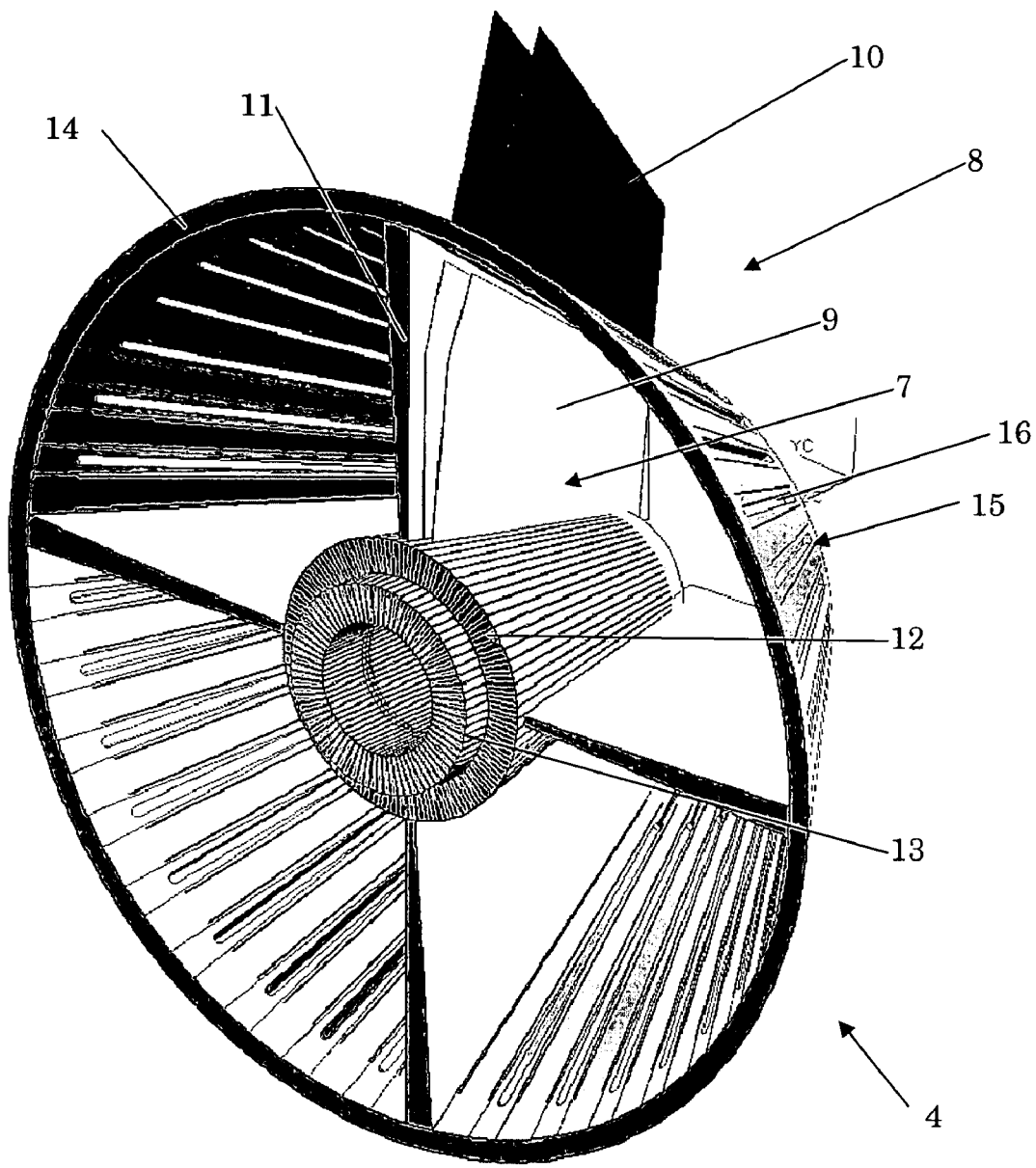
FIG. 3 shows a schematic view of an embodiment according to the invention.

Discussing in more detail the embodiment depicted in FIG. 3, the contamination barrier 4 comprises an inner segment 7, in the form of an inner cup, integrated with an outer segment 8, in the form of an outer ring. For purposes of intelligibility only two inner blades 9 are depicted, and two outer blades 10.

Although it is feasible that the inner and outer segments are mounted disconnected relative to each other, in this embodiment a connection between the inner segment 7 and the outer segment 8 is formed by four connecting spokes 11. The inner cup may be formed monolithically, that is, comprising a rotating shaft 12 having attached thereto a plurality of inner blades 9. In the embodiment depicted, the shaft 12 rotates around a central fixed axis 13, for example, using air bearings. The outer segment 8 is formed as a hollow shaft 14 or ring structure, having outer blades 10 attached thereto. In one embodiment, the outer segment 8 may be formed as a monolithic part, for example of an alloy, commercially obtainable as Haines 282™. Blade thickness may range from 100-300 micrometers. This material is a wrought gamma-prime strengthened alloy and contains 56-60 weight percentage nickel, 17-21 weight percentage chromium, 8-12 weight percentage molybdenum, 1-2 weight percentage aluminum and 1.5-2.5 weight percentage titanium. In particular, this material shows creep strength values for I percentage creep in 1000 hours, of 33 N/mm$^2$ for a temperature of 927° C.; 68 N/mm$^2$ for a temperature of 871° C.; 145 N/mm$^2$ for a temperature of 816° C. and 241 N/mm$^2$ for a temperature of 760° C. It can therefore provide reliable structural integrity having a creep strength of more than 100 MPa for a production of 1 percent creep in 1000 hours, at a working temperature of 800° C. Thus, effectively, the radial length of the blades 5 is limited and the centrifugal force impacting the blades 5 is also limited by this design. The centrifugal forces exerted on the outer segment 8 are impacting on the ring structure 14 and not adding to the centrifugal forces exerted on the blades 5 of the inner segment 7. The spokes are preferably relatively stiff in order to withstand accelerating rotational forces and centrifugal forces exerted by the rotating foil trap 4. Results indicate that a favorable temperature distribution of the foil trap 4 is obtainable for a segmented configuration comprising hollow outer shaft 14.

Figure 4:
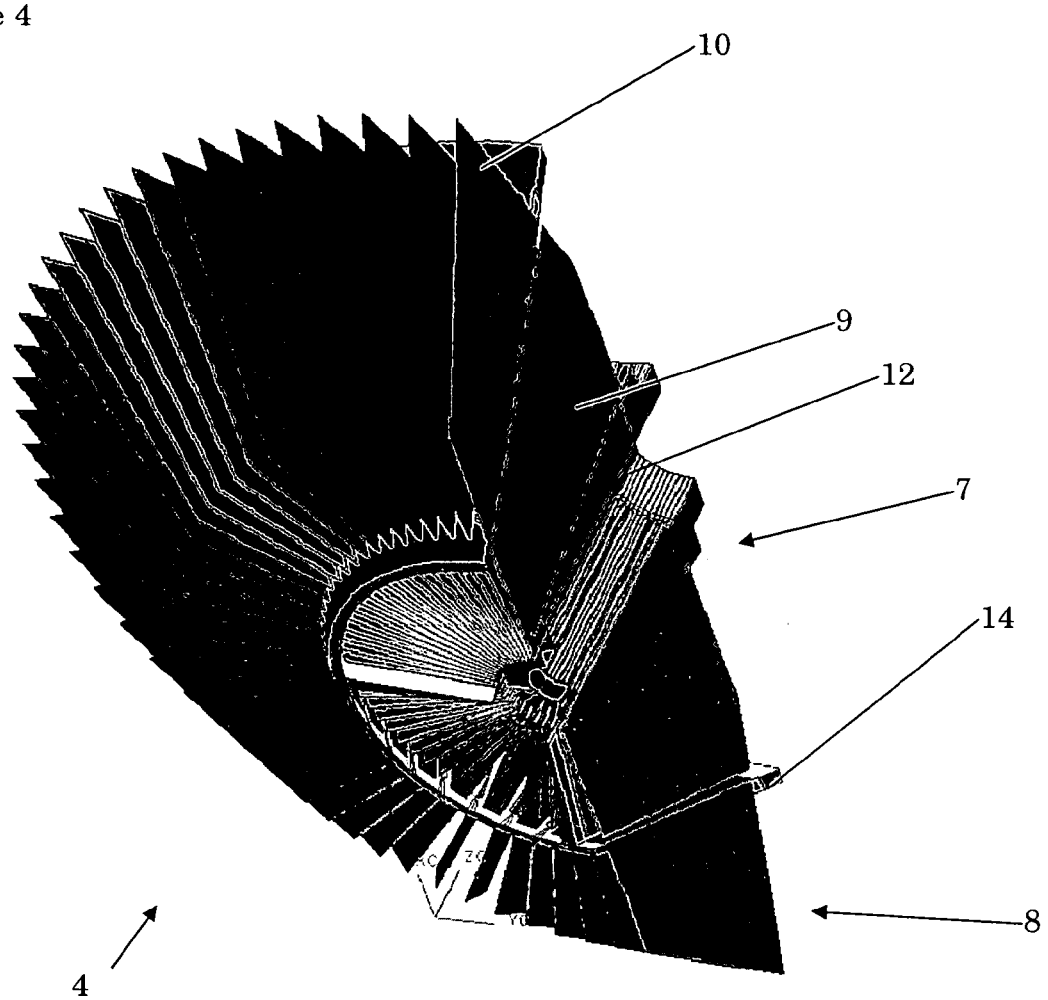
FIG. 4 shows a sectional view of the embodiment depicted in FIG. 3.

FIG. 4 shows a sectional view of the foil trap depicted in FIG. 3 having all inner blades 9 and outer blades 10 attached thereto. In one embodiment of the invention a number of foils around a circumference of an inner segment may be smaller than a number of foils around a circumference of an outer shaft. For instance, it may be easier to arrange a denser blade structure on the outer segment 8. Also, the blade thickness may vary, for instance, it may be easier to provide a blade structure having a smaller thickness of blades for the outer segment 8.

In the embodiment of FIG. 4, a guiding structure 15 may be provided in the outer ring 14 to guide deposited debris, for instance, deposited Tin generated by a tin plasma source, from the inner segment 7 to the outer segment 8. In particular, this could be provided by a plurality of openings 16 in the form of through-holes or grooves. The grooves may guide the debris spun away from the first segment, through the ring 14, so that it can be centrifuged radially away from the contamination barrier 4.

Figure 5:
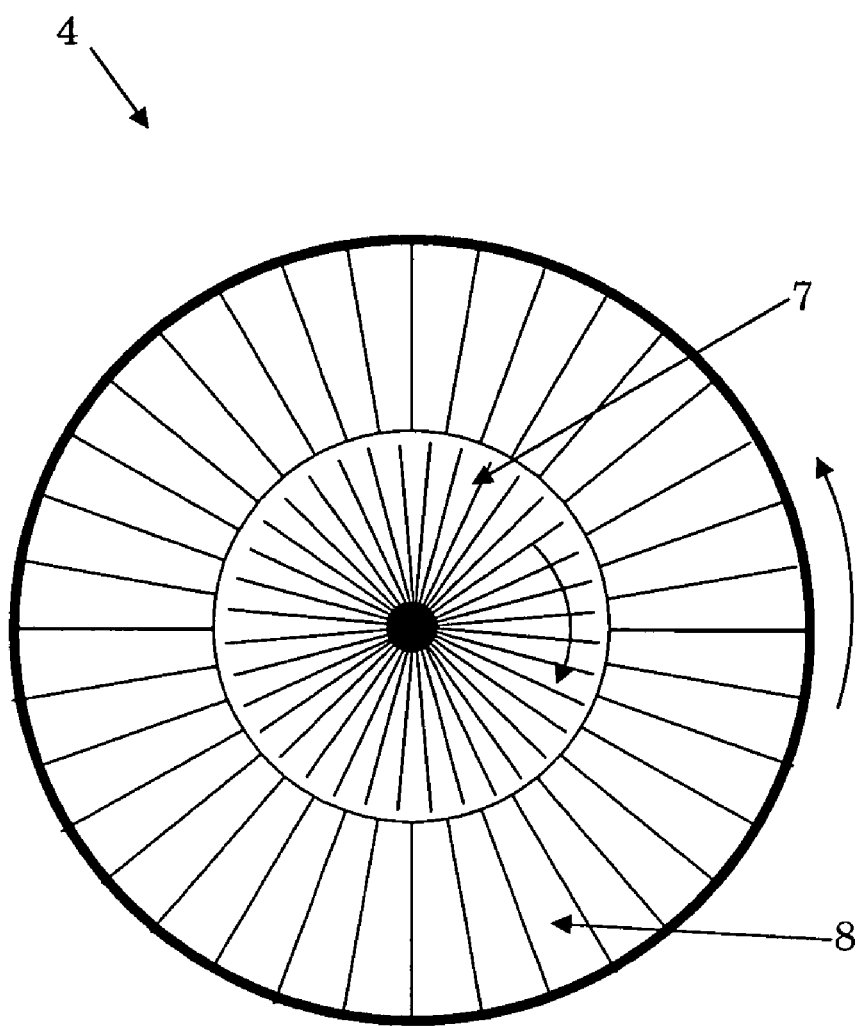
FIG. 5 shows another embodiment of a rotating foil trap according to the invention.

In the embodiment depicted in FIG. 5, the inner segment 7 and outer segment 8 are disconnected from each other and may even rotate in opposite directions and/or with differing rotating speeds. For instance, the inner segment can rotate with a higher speed than the outer segment 8, since the outer segment 8 may have a denser configuration of blades, resulting in an enhanced suppression rate of debris for debris traveling in the direction of the outer segment 8.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in.a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A rotatable contamination barrier for use in an EUV radiation system, the contamination barrier comprising a plurality of closely packed blades for trapping contaminant material coming from an EUV radiation source, the blades being oriented radially relative to a central rotation axis of the contamination barrier, the contamination barrier being segmented in an inner segment and an outer segment relative to the central rotation axis.

2. A rotatable contamination barrier according to claim 1, further comprising connectors for connecting said inner and said outer segment.

3. A rotatable contamination barrier according to claim 1, wherein said inner segment comprises a plurality of closely packed inner blades attached to a rotating inner shaft, and wherein said outer segment comprises a hollow outer shaft comprising said inner segment, wherein a plurality of closely packed outer blades are connected to said hollow outer shaft.

4. A rotatable contamination barrier according to claim 3, wherein said inner and said outer shaft are connected through spokes.

5. A rotatable contamination barrier according to claim 1, wherein said inner segment and said outer segment are formed as truncated cones.

6. A rotatable contamination barrier according to claim 5, wherein said inner cone spans a top angle ranging between 30-40 degrees and wherein said outer cone spans a top angle ranging between 45-55 degrees.

7. A rotatable contamination barrier according to claim 1, wherein a number of foils around a circumference of an inner segment is smaller than a number of foils around a circumference of an outer shaft.

8. A rotatable contamination barrier according to claim 7, wherein said inner and outer segments rotate with differing rotating speeds.

9. A rotatable contamination barrier according to claim 8, wherein the rotation speed of the inner segment is higher than the rotation speed of the outer segment.

10. A rotatable contamination barrier according to claim 1, wherein said outer segment comprises a guiding structure for guiding a flow of material that is centrifuged away from the first segment away from an axial end thereof.

11. A rotatable contamination barrier according to claim 10, wherein said guiding structure comprises an opening in the outer shaft for guiding debris centrifuged away from the first segment through the outer shaft.

12. A lithographic apparatus comprising:
a radiation system comprising an EUV radiation source for providing an EUV beam of radiation, and a rotatable contamination barrier comprising a plurality of closely packed blades for trapping contaminant material coming from the EUV radiation source, the blades being oriented radially relative to a central rotation axis of the contamination barrier, the contamination barrier being segmented in an inner segment and an outer segment relative to the central rotation axis;
a support constructed to support a patterning device, the patterning device being capable of imparting the beam of radiation with a pattern in its cross-section to form a patterned radiation beam;
a substrate table constructed to hold a substrate; and
a projection system configured to project the patterned radiation beam onto a target portion of the substrate.

* * * * *